(12) United States Patent
Huo et al.

(10) Patent No.: US 8,299,454 B2
(45) Date of Patent: Oct. 30, 2012

(54) NANO LINE STRUCTURES IN MICROELECTRONIC DEVICES

(75) Inventors: ZongLiang Huo, Gyeonggi-do (KR); Subramanya Mayya, Gyeonggi-do (KR); Xiaofeng Wang, Gyeonggi-do (KR); In-Seok Yeo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/961,883

(22) Filed: Dec. 7, 2010

(65) Prior Publication Data

US 2011/0073841 A1 Mar. 31, 2011

Related U.S. Application Data

(62) Division of application No. 11/853,313, filed on Sep. 11, 2007, now Pat. No. 7,863,138.

(30) Foreign Application Priority Data

Nov. 15, 2006 (KR) .................. 10-2006-0112875

(51) Int. Cl.
H01L 29/06 (2006.01)
(52) U.S. Cl. ................... 257/24; 257/E29.166; 977/938
(58) Field of Classification Search ............... 257/9, 24, 257/E29.55, E29.166; 977/938
See application file for complete search history.

(56) References Cited

U.S. PATENT DOCUMENTS

| 6,781,166 B2 | 8/2004 | Lieber et al. |
| 2004/0228961 A1 | 11/2004 | Smits et al. |
| 2005/0189859 A1 | 9/2005 | Tsuruoka et al. |
| 2006/0141222 A1* | 6/2006 | Fischer et al. ............ 428/172 |
| 2007/0265379 A1* | 11/2007 | Chen et al. ............... 524/404 |
| 2008/0303029 A1* | 12/2008 | Kawashima et al. ........ 257/72 |

FOREIGN PATENT DOCUMENTS

| JP | 2005-169614 | 6/2005 |
| KR | 1020030032726 A | 4/2003 |
| KR | 1020050060080 A | 6/2005 |
| KR | 1020050116925 A | 12/2005 |
| KR | 1020050121443 A | 12/2005 |
| KR | 10-0593257 B1 | 6/2006 |
| WO | WO 2006085559 A1 * | 8/2006 |

OTHER PUBLICATIONS

Office Action corresponding to Korean Application No. 10-2006-0112875 mailed Oct. 24, 2007.
Sheu et al. "Preparation of nano-scale patterns on the silicon oxide surface by dip-pen nanolithography", *Nanotechnology*, $5^{th}$ IEEE Conference 2:701-704 (2005).
Notice of Allowance corresponding to Korean Application No. 10-2006-0112875 mailed Feb. 21, 2008.

* cited by examiner

*Primary Examiner* — William D Coleman
*Assistant Examiner* — Christine Enad
(74) *Attorney, Agent, or Firm* — Myers Bigel Sibley & Sajovec, P.A.

(57) ABSTRACT

A method of forming a microelectronic device includes forming a groove structure having opposing sidewalls and a surface therebetween on a substrate to define a nano line arrangement region. The nano line arrangement region has a predetermined width and a predetermined length greater than the width. At least one nano line is formed in the nano line arrangement region extending substantially along the length thereof and coupled to the surface of the groove structure to define a nano line structure. Related devices are also discussed.

12 Claims, 9 Drawing Sheets

NANO LINE STRUCTURES IN MICROELECTRONIC DEVICES

CROSS-REFERENCE TO RELATED APPLICATIONS

This application is a divisional of and claims priority from U.S. patent application Ser. No. 11/853,313, filed on Sep. 11, 2007, now U.S. Pat. No. 7,863,138 which claims priority under 35 USC §119 from Korean Patent Application No. 10-2006-0112875 filed on Nov. 15, 2006 in the Korean Intellectual Property Office, the disclosures of which are incorporated herein by reference in their entireties.

FIELD OF THE INVENTION

The present invention relates to microelectronic devices and methods of fabricating the same.

BACKGROUND OF THE INVENTION

As integration of integrated circuit devices increases, line widths of wires may be reduced, and an amount of current per unit area, that is, a current density, may be increased. However, conventional metal wire may be limited to a minimum width of about 70 nm, and the maximum current density may be about $10^6$ A/cm$^2$. Currently, nano lines such as carbon nano tubes may provide a wiring substance having a relatively high current density at smaller line widths than that of metal wires.

Some methods of forming nano lines on a substrate may be classified into methods of directly synthesizing nano lines on a substrate using a catalyst layer, and methods of arranging synthesized nano lines on a substrate. Examples of methods of arranging nano lines on the substrate may include an air flow method, an electrical field method, a magnetic field method, a microfluidic flow method, a mechanical force manipulation method, and/or a Langmuir-Blodgett method.

SUMMARY OF THE INVENTION

According to some embodiments of the present invention, a method of fabricating a microelectronic device includes forming a groove structure having opposing sidewalls and a surface therebetween on a substrate to define a nano line arrangement region. The nano line arrangement region has a predetermined width and a predetermined length greater than the width. At least one nano line is formed in the nano line arrangement region extending substantially along the length thereof and coupled to the surface of the groove structure to define a nano line structure.

According to other embodiments of the present invention, a microelectronic device may include a substrate and a groove structure formed on the substrate. The groove structure may include a nano line arrangement groove and at least one nano line having a length greater than a width of the nano line arrangement groove and coupled with a bottom side of the nano line arrangement groove.

According to other embodiments of the present invention, a microelectronic device may include a substrate, a plurality of nano line arrangement regions formed on the same layer on the substrate and having different lengths, and a plurality of nano lines coupled with the nano line arrangement regions and each having a length that are larger than a width of each of the nano line arrangement regions.

According to further embodiments of the present invention, a method of fabricating a microelectronic device may include forming a groove structure including a nano line arrangement groove on a substrate, and coupling at least one nano line having a length larger than a width of the nano line arrangement groove with a bottom side of the nano line arrangement groove.

DETAILED DESCRIPTION OF EMBODIMENTS OF THE INVENTION

Figure 1:
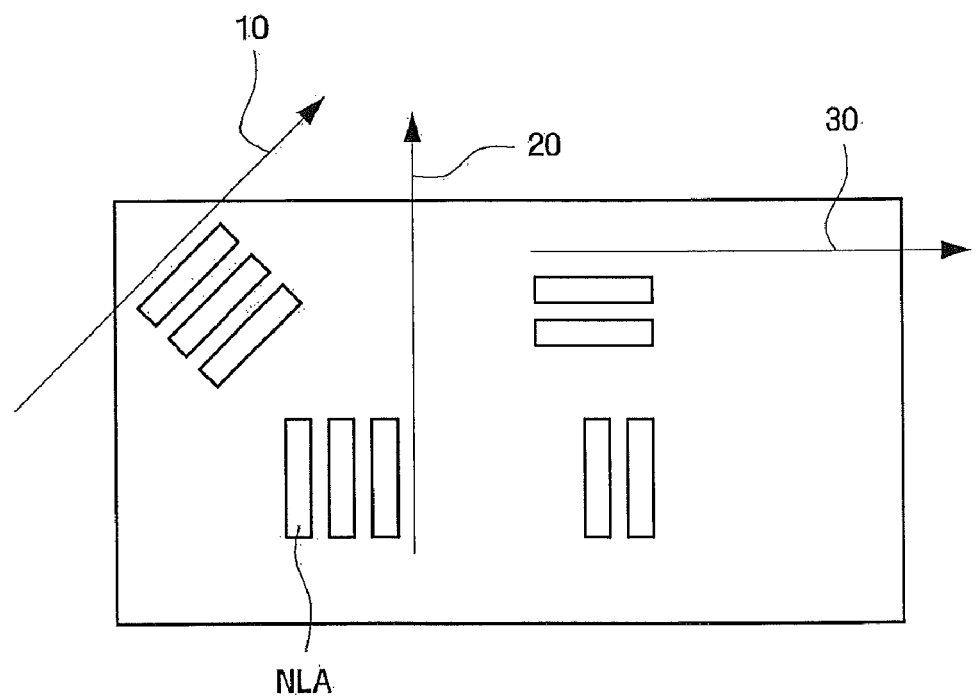
FIG. 1 is a layout view schematically illustrating microelectronic devices according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein. The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

As appreciated by the present inventors, the above-mentioned conventional methods may be disadvantageous in that it may be difficult to commercialize the methods in view of wafer scale. For example, in view of commercial wafer manufacturing, nano lines may be arranged in a plurality of directions to provide desirable wafer scales for various types of chip structures fabricated on the wafers. However, conventional methods may be disadvantageous in that the nano lines may be unidirectionally arranged during a corresponding manufacturing process. Accordingly, as such a process may require repetition in order to arrange the nano lines in a plurality of directions, fabrication efficiency may be reduced. In addition, since it may be difficult to precisely arrange the nano lines in desired positions on the wafer, and since additional devices and/or processes may be used to achieve a desired arrangement, fabrication costs may be increased.

Hereinafter, microelectronic devices according to embodiments of the present invention will be described with reference to the accompanying drawings.

Figure 2:
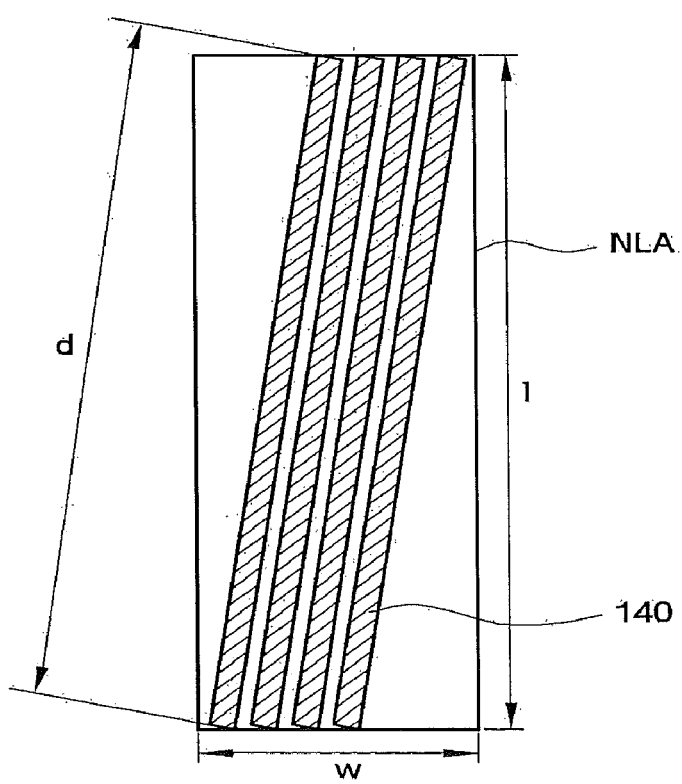
FIG. 2 is an enlarged view of a nano line arrangement region of FIG. 1.

FIG. 1 is a layout view schematically illustrating microelectronic devices according to some embodiments of the present invention. FIG. 2 is an enlarged view of a nano line arrangement region of FIG. 1.

With reference to FIGS. 1 and 2, the microelectronic device includes at least one nano line arrangement region NLA. At least one nano line 150 is disposed in the nano line arrangement region NLA.

The nano line arrangement region NLA may extend in a predetermined direction. The nano line arrangement region NLA has a predetermined length l and a predetermined width w. The width w may be smaller than the length l. Examples of the shape of the nano line arrangement region NLA may include a rectangle and a parallelogram. As described herein, the extending direction of the nano line arrangement region NLA is defined by the length direction.

When a microelectronic device includes a plurality of nano line arrangement regions NLA, at least two nano line arrangement regions NLA may be disposed in the same layer. Additionally, at least two of the nano line arrangement regions NLA that are disposed in the same layer may extend in different directions. That is, the line arrangement regions may have different length directions. A specific example is shown in FIG. 1. In FIG. 1, the length direction of a nano line arrangement region NLA is a first direction 10, the length direction of another nano line arrangement region NLA is a second direction 20, and the length direction of still another nano line arrangement region NLA is a third direction 30.

The nano line 150 is defined as a line that has a size on the order of nanometer. For example, in some embodiments, the nano line 150 may be a conductive line having a width and/or a diameter of several to several tens of nm. Accordingly, as shown in FIG. 2, the nano line 150 may form a long rod having a relatively small thickness. In addition, the nano line 150 may have a cylindrical shape and/or a tubular shape. In some embodiments of the present invention, a carbon nano tube or a nano wire may be used as the nano line 150.

The nano line 150 is disposed in the nano line arrangement region NLA to define a nano line structure. In some embodiments of the present invention, the nano line 150 is disposed only in the nano line arrangement region NLA, and the nano line does not deviate from the nano line arrangement region NLA. As such, the nano line arrangement region NLA is defined as a region in which the nano lines 150 are arranged.

One or more nano lines 150 may be disposed in the nano line arrangement region NLA. As such, a varying number of nano lines 150 may be disposed in each nano line arrangement region NLA. In the case of when two or more nano lines 150 are disposed in the single nano line arrangement region NLA, the nano lines 150 in the single nano line arrangement region NLA may be unidirectionally disposed parallel to each other. As used herein, "parallel" may mean that the extension directions or the length directions of the nano lines 150 are parallel to each other or substantially parallel to each other.

The length d of the nano line 150 may be greater than the width w of the nano line arrangement region NLA. In the case of when the length d of the nano line 150 is larger than the width w of the nano line arrangement region NLA, the nano lines 150 are not arranged in the width direction of the nano line arrangement region NLA. That is, the nano lines 150 are arranged in the length direction of the nano line arrangement region NLA. In some embodiments of the present invention, the arrangement direction of the nano lines 150 may be the same as the length direction of the nano line arrangement region NLA. However, in other embodiments of the present invention, the arrangement direction of the nano lines 150 may be at a predetermined angle to the length direction of the nano line arrangement region NLA, as shown in FIG. 2. More particularly, when the length 1 of the nano line arrangement region NLA is smaller than the length d of the nano line 150, the nano lines 150 may be diagonally arranged in the nano line arrangement region NLA. However, in this case, since the length d of the nano line 150 is larger than the width w of the nano line arrangement region NLA, the angle between the length directions of the nano line 150 and the nano line arrangement region NLA may be smaller than 45°.

Figure 3:
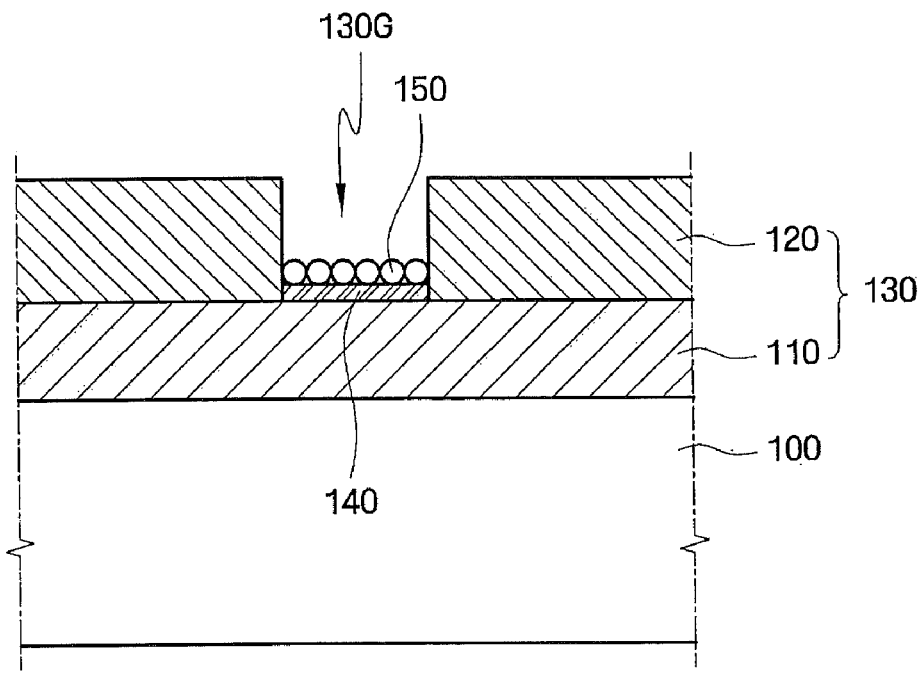
FIG. 3 is a cross-sectional view of a microelectronic device according to some embodiments of the present invention.

FIG. 3 is a cross-sectional view of a microelectronic device according to some embodiments of the present invention, which is taken along the width direction of the nano line arrangement region included in the microelectronic device.

As shown in FIG. 3, the microelectronic device according to the embodiment of the present invention may include a groove structure 130 that is formed on a substrate 100 and has a nano line arrangement groove 130G. Here, the nano line arrangement groove 130G is an example of the above-mentioned nano line arrangement region (NLA of FIG. 1), and at least one nano line 150 is disposed in the nano line arrangement groove 130G.

The groove structure 130 may include a coupling layer 110 and a mask layer pattern 120 that are sequentially formed on the substrate 100.

The substrate 100 may be a semiconductor substrate that is made of at least one selected from the group consisting of Si, Ge, SiGe, GaP, GaAs, SiC, SiGeC, InAs, and InP.

The coupling layer 110 that is a constituent element of the groove structure 130 is capable of being directly coupled with the nano line 150 or coupled through a first linker 140, as described below, to the nano line 150. Any material may be used to fabricate the coupling layer 110 as long as the material is capable of being coupled with the nano line 150. For example, an oxide layer or a metal layer may be used to fabricate the coupling layer. A silicon oxide layer may be used as the oxide layer. In detail, the coupling layer 110 may be a silicon oxide layer that is formed on an upper surface of a Si substrate in a structure which is called an SOI (Silicon On Insulator) substrate. The coupling layer 100 may cover an entire surface of the substrate while not being patterned.

The mask layer pattern 120 that is another constituent element of the groove structure 130 is formed on the coupling layer 110, and patterned in a predetermined region to expose the surface of the coupling layer 110. The exposed surface of the coupling layer 110 and the patterned wall of the mask layer pattern 120 constitute the nano line arrangement groove 130G. In detail, the bottom side of the nano line arrangement groove 130G is the surface of the coupling layer 110, and the sidewalls of the nano line arrangement groove 130G are the sidewalls of the mask layer pattern 120. In connection with this, the nano line arrangement groove 130G is an example of the nano line arrangement region (NLA of FIG. 1). The width of the bottom side of the nano line arrangement groove 130G, that is, the width of the coupling layer 110 that is exposed through the mask layer pattern 120, is smaller than the length of the nano line 140.

The mask layer pattern 120 may not be coupled with the first linker 140. Accordingly, the mask layer pattern 120 may be made of a substance that is different from the materials constituting the coupling layer 110 and/or the first linker 140. For example, the mask layer pattern may be formed of a silicon nitride film.

The nano lines 150 are coupled with the exposed portion of the coupling layer 110 in the bottom of the nano line arrangement groove 130G. The nano lines 150 are coupled with the coupling layer 110 while the nano lines are parallel to the coupling layer 110. For example, the nano lines 150 may be longitudinally coupled. Therefore, the nano lines 150 may be longitudinally coupled with the coupling layer 110 at a plurality of points.

In some embodiments of the present invention, as shown in FIG. 3, the nano lines 150 may be coupled with the coupling layer 110 through the first linker 140.

Figure 4:
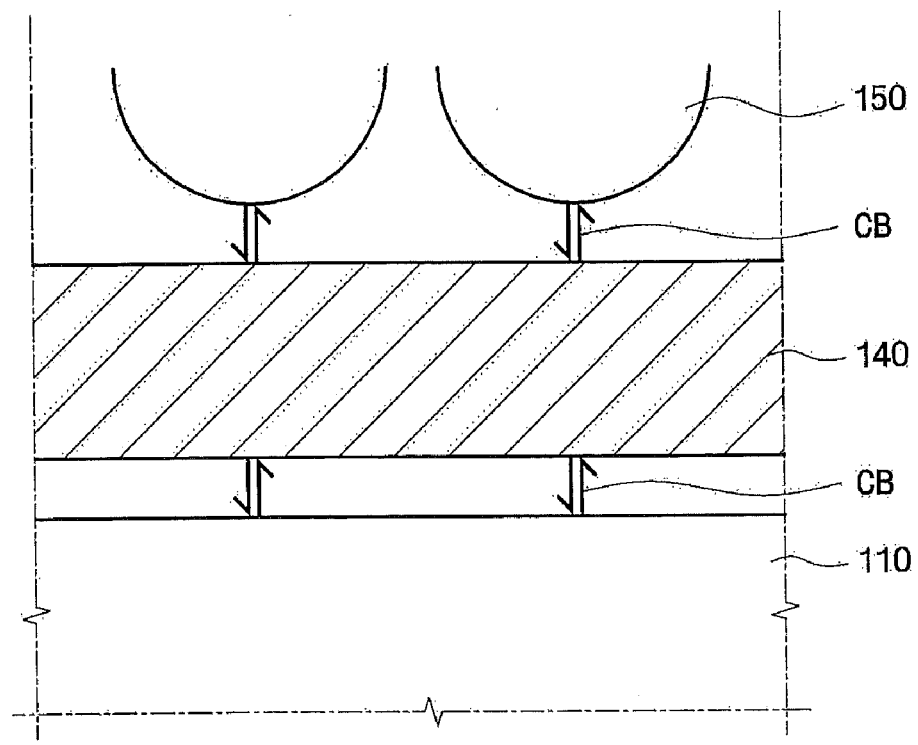
FIG. 4 is a view showing coupling of nano lines of FIG. 3 to a coupling layer.

FIG. 4 is an enlarged cross-sectional view showing the coupling of the nano lines of FIG. 3 with the coupling layer 110. As shown in FIG. 4, the nano lines 150 are coupled with a side of the first linker 140, and the coupling layer 110 is coupled with another side of the first linker 140. The coupling between the nano lines 150 and the coupling layer 110 and between the coupling layer 110 and the first linker 140 may be provided by, for example, a covalent bond (CB). The covalent bond (CB) provides molecules with strong bonding strength. Accordingly, the coupling between the coupling layer 110 and the nano lines 150 may be stabilized.

In order to perform the coupling, the first linker 140 may include a first functional group and a second functional group. The first functional group is a functional group that is selectively covalently bonded to the coupling layer 110. The second functional group is a functional group that is capable of covalently bonded to the nano lines 150. The first linker 140 may be represented by the following Formula 1.

X-A-Y            Formula 1

In the above Formula 1, X denotes the first functional group, and Y denotes the second functional group. A is a body of the first linker 140.

The coupling layer 110 and the nano line 150 may be coupled with each other through the first linker 140. The coupling is achieved by means of the first functional group and the second functional group of the first linker. Accordingly, a variety of substances may be applied to A (i.e., the body of the first linker 140). For example, a substance that contains a straight chain or branched chain alkyl group, an alkenyl group, an alkynyl group, a cycloalkyl group, and/or a cycloalkenyl group may be applied. More particularly, when the coupling layer 110 includes a silicon oxide layer, the first functional group that is covalently bonded to the coupling layer 110 may be an amine group and/or a silane group. Also, when the nano line 150 is formed of the carbon nano tube to have carbon, the second functional group that is covalently bonded to the nano line may be a diazonium group, such as $BF_4N_2$ and/or an amine group.

Meanwhile, the mask layer pattern 120 may not be coupled with the first linker 140 and/or the bonding strength of the mask layer pattern to the first linker 140 may be less than that of the coupling layer 110 to the first linker, such that the nano line 150 may be selectively coupled with only the coupling layer 110. That is, the mask layer pattern 120 may be made of a material that is not covalently bonded to the first functional group and/or the second functional group of the first linker 140. For example, when the mask layer pattern 120 is formed of a silicon nitride film, the mask layer pattern 120 may not be covalently bonded to the first functional group or the second functional group such as the diazonium group, the amine group, and/or the silane group, and it may be relatively easy to prevent the mask layer pattern 120 from being coupled with the first linker 140 including the functional group having the above mentioned substance.

Hereinafter, microelectronic devices according to some embodiments of the present invention will be described. FIGS. 5 to 13 are cross-sectional views of the microelectronic devices according to various embodiments of the present invention.

Figure 5:
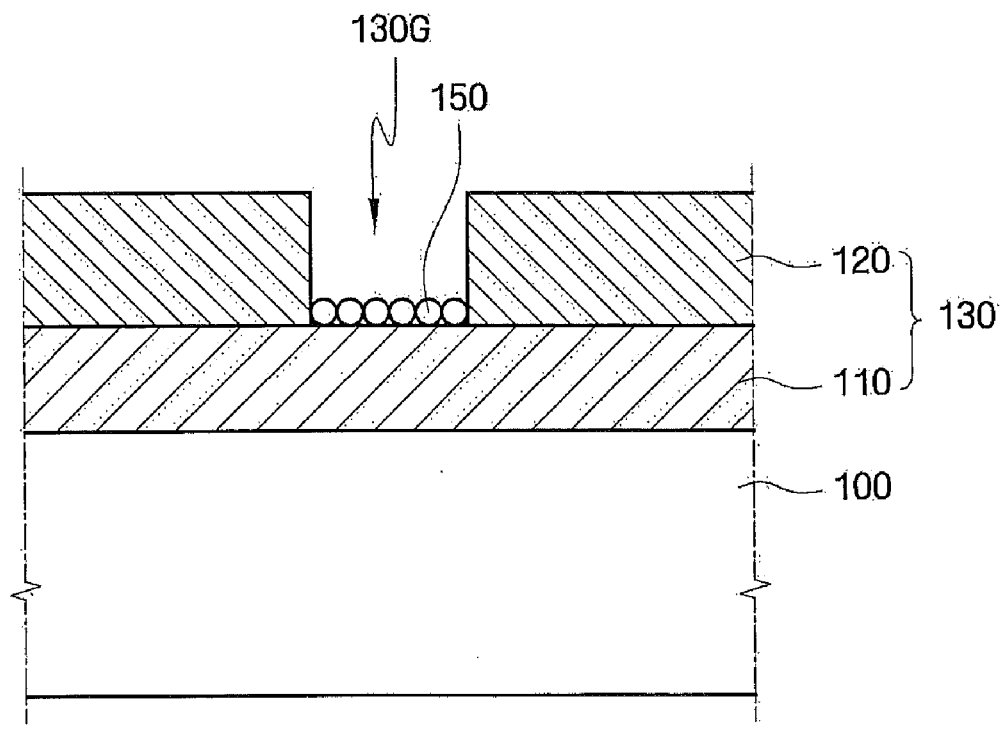
FIGS. 5 to 13 are cross-sectional views of microelectronic devices according to some embodiments of the present invention.

As shown in FIG. 5, the nano line 150 is directly coupled with the coupling layer 110 that constitutes the bottom side of the nano line arrangement groove 130G while the first linker (reference numeral 140 of FIG. 3) may be not provided between the nano line 150 and the coupling layer 110 in some embodiments of the present invention. That is, in the embodiment of FIG. 5, the first linker (reference numeral 140 of FIG. 3) is not included. The coupling between the nano line 150 and the coupling layer 110 is performed by, for example, van der Waals bonding. As described above, if the nano line 150 is directly coupled with the coupling layer 110 while the first linker (reference numeral 140 of FIG. 3) is not provided between the nano line 150 and the coupling layer 110, electric properties of the nano line 150 can be improved. That is, electrical properties such as resistance can be improved in comparison with the case of when a substance is provided between the nano line 150 and the coupling layer 110.

Figure 6A:
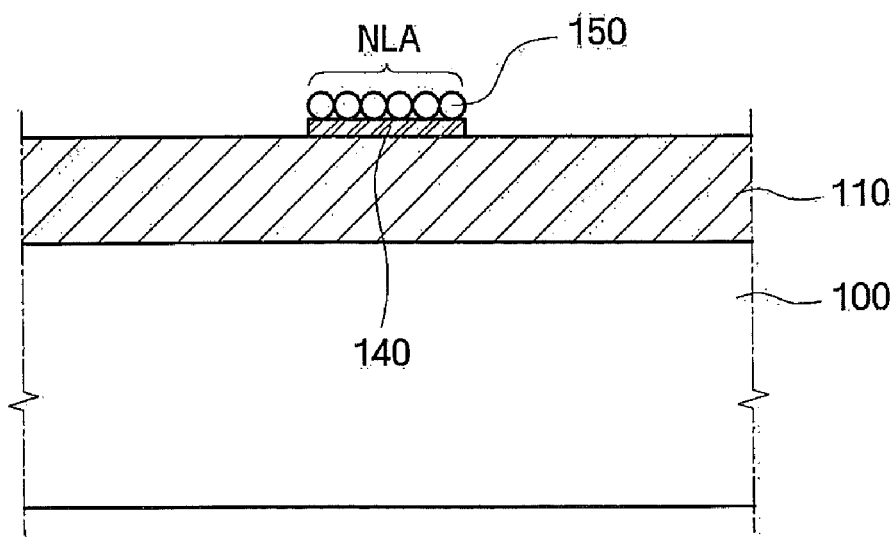
Figure 6B:
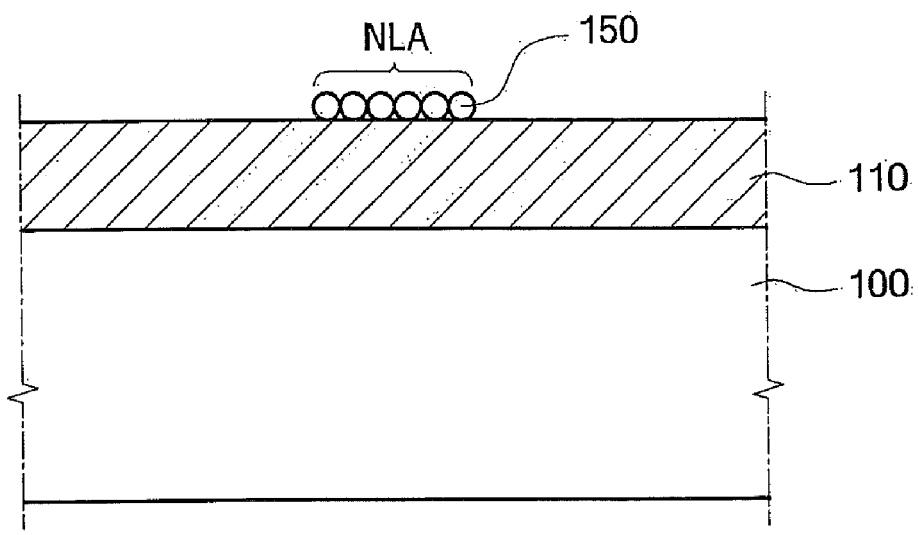

Meanwhile, the nano line arrangement groove 130G may not be provided in other embodiments of the present invention. For example, in the embodiments of FIGS. 3 and 5, the nano line arrangement groove 130G is defined by the mask layer pattern 120 on the coupling layer 110. However, if the mask layer pattern 120 is removed, the nano line arrangement groove 130G is not defined, and the whole surface of the coupling layer 110 is exposed. Accordingly, the nano line arrangement region NLA in which at least one nano line 150 is disposed may have a substantially planar shape. FIG. 6A illustrates a microelectronic device having a structure which is substantially similar to the structure according to the embodiment of FIG. 3 except that the mask layer pattern 120 is removed and/or otherwise not present. FIG. 6B illustrates a microelectronic device having a structure which is substantially similar to the structure according to the embodiment of FIG. 5 except that the mask layer pattern 120 and the first linker 140 are removed and/or otherwise not present. In FIGS. 6A and 6B, the nano line arrangement region NLA has a substantially planar shape.

Figure 7:
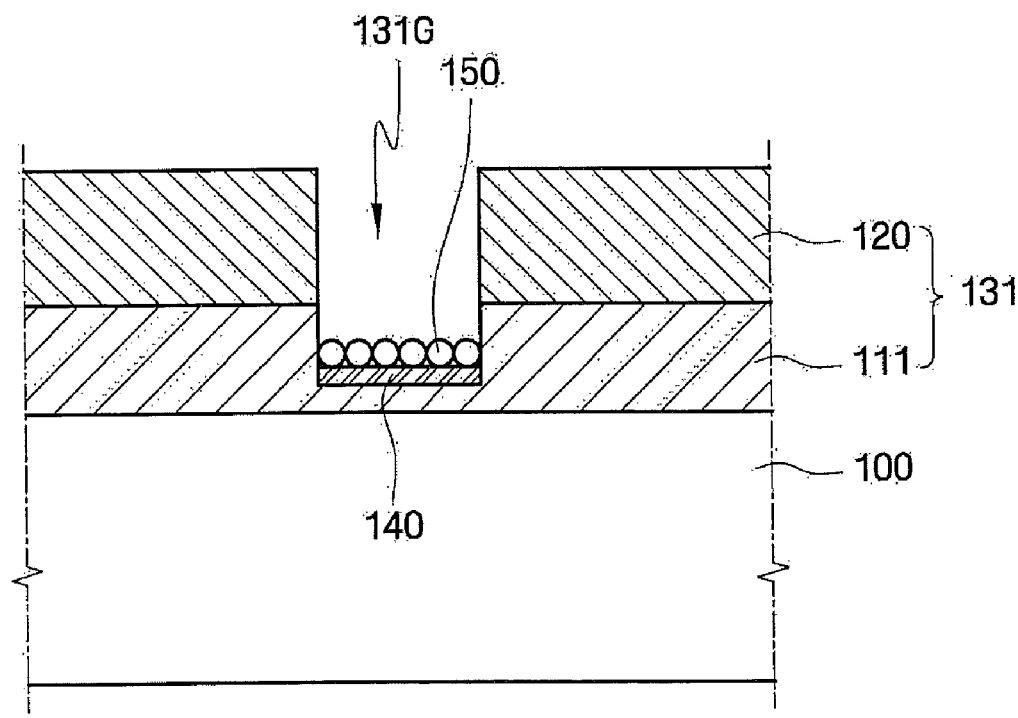
Figure 8:
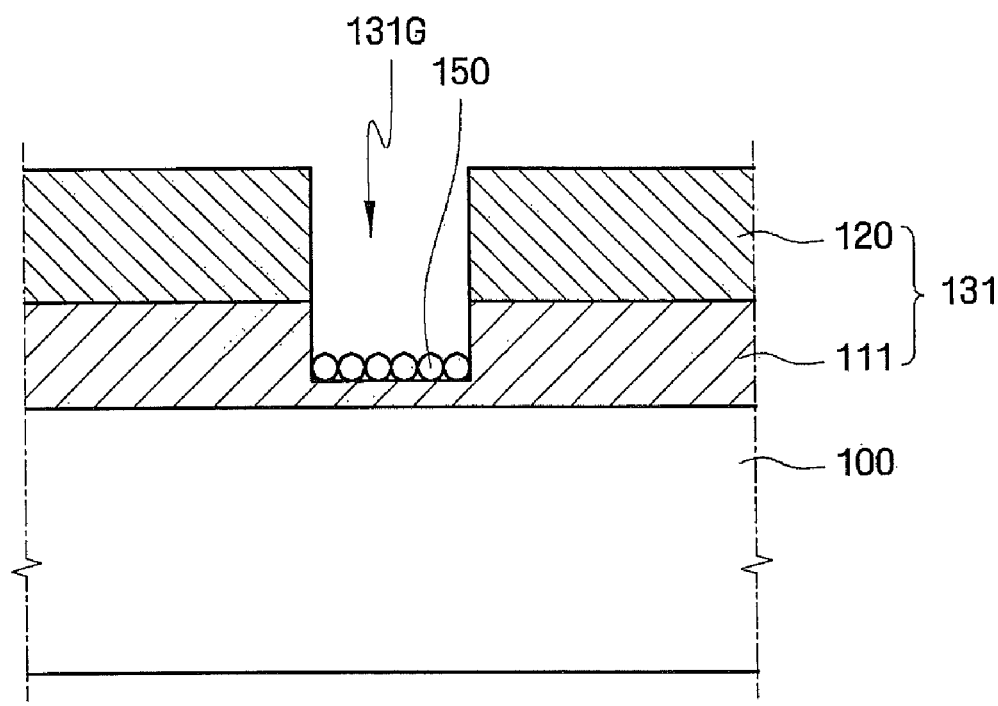

FIGS. 7 and 8 illustrate the case of a coupling layer 111 including a recess therein that defines a portion of a nano line arrangement groove 131G according to some embodiments of the present invention. With reference to FIGS. 7 and 8, the coupling layer 111 that constitutes the bottom side of the nano line arrangement groove 131G may have a recess therein. That is, a surface of a portion of the coupling layer 111 that constitutes the bottom of the nano line arrangement groove 131G is recessed toward the substrate 100 in comparison with other portions of the coupling layer 111 such that the nano line arrangement groove 131G extends into the coupling layer 111. The portions of the coupling layer 111 in which the nano line arrangement groove 131G is not formed may be covered with the mask layer pattern 120. Therefore, the portions of the coupling layer 111 in which the nano line arrangement groove 131G is not formed may provide an interface between the coupling layer 111 and the mask layer pattern 120.

Since the coupling layer 111 has the recess, the sidewalls of the nano line arrangement groove 131G are formed by the sidewall of the mask layer pattern 120 and the sidewalls of the recess in the coupling layer 111. Accordingly, the depth of the nano line arrangement groove 131G according to the embodiments of FIGS. 7 and 8 may be relatively larger than that of the nano line arrangement groove according to the embodiments of FIGS. 3 and 5.

Figure 9A:
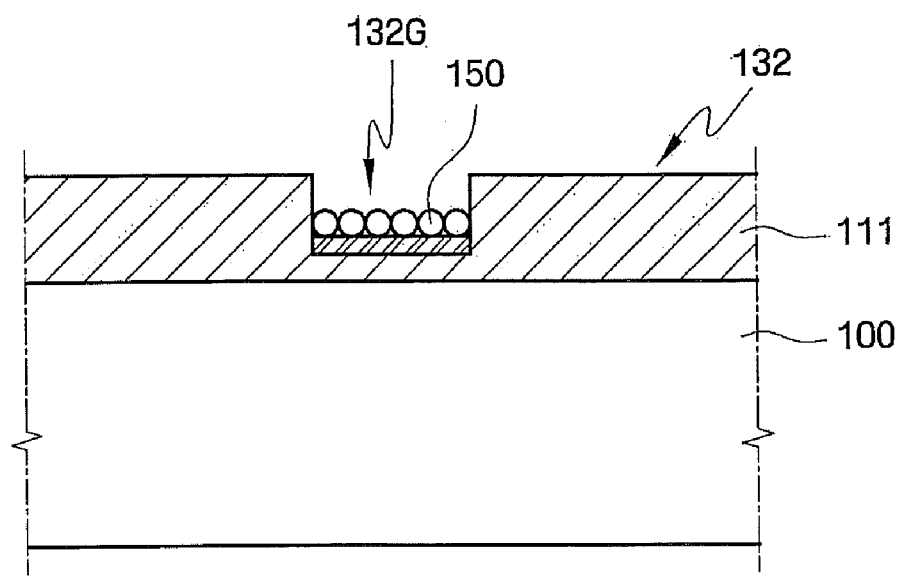
Figure 9B:
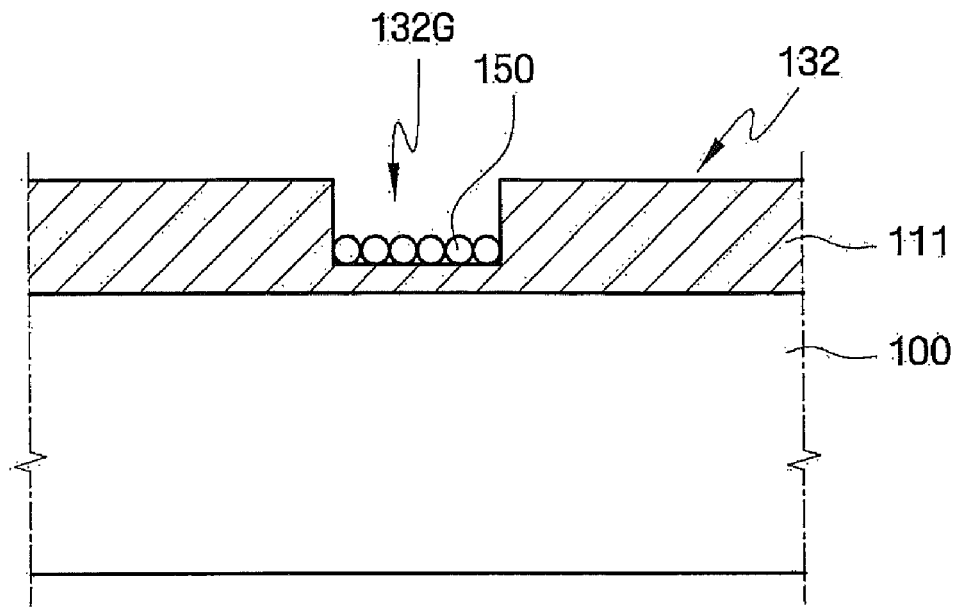

In some embodiments of the present invention, the nano line arrangement groove may be formed by only the recess of the coupling layer 111 where the mask layer pattern 120 is not provided. Examples of a nano line arrangement groove having the above-mentioned structure are shown in FIGS. 9A and 9B. The nano line arrangement grooves of FIGS. 9A and 9B have substantially similar structures as the nano line arrangement grooves according to the embodiments of FIGS. 7 and 8 except that the mask layer pattern 120 is removed and/or otherwise not present. Accordingly, in a groove structure 132, a nano line arrangement groove 132G is formed by only the coupling layer 111 having the recess without the mask layer pattern.

Figure 10:
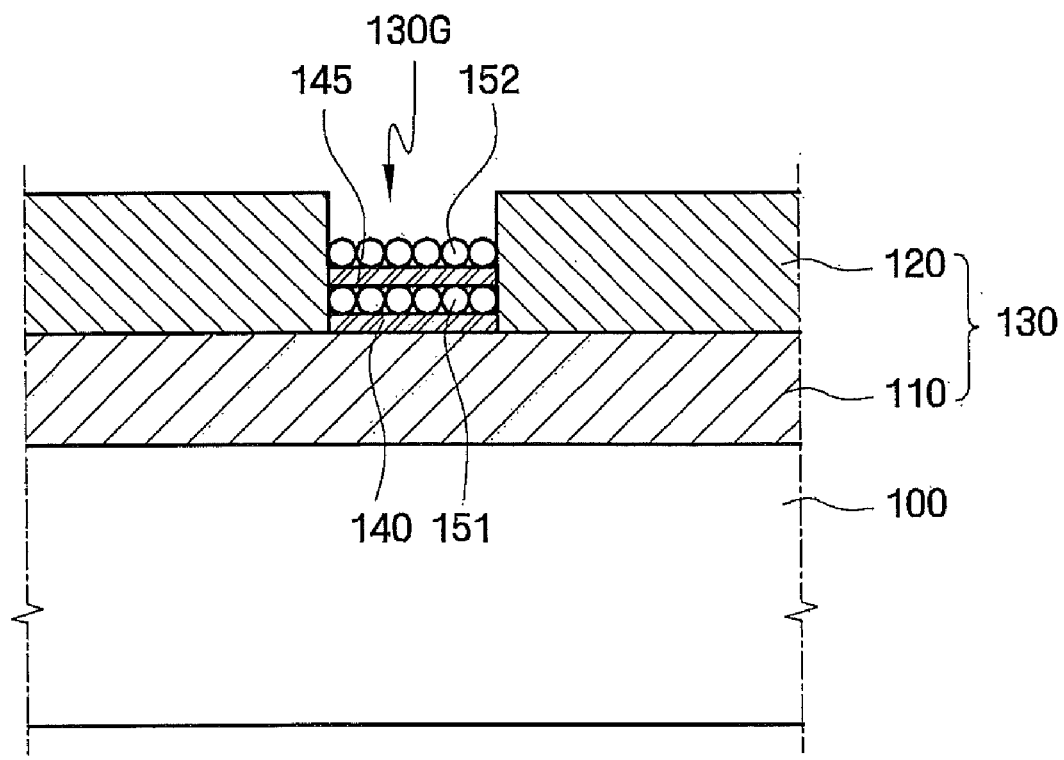
Figure 11:
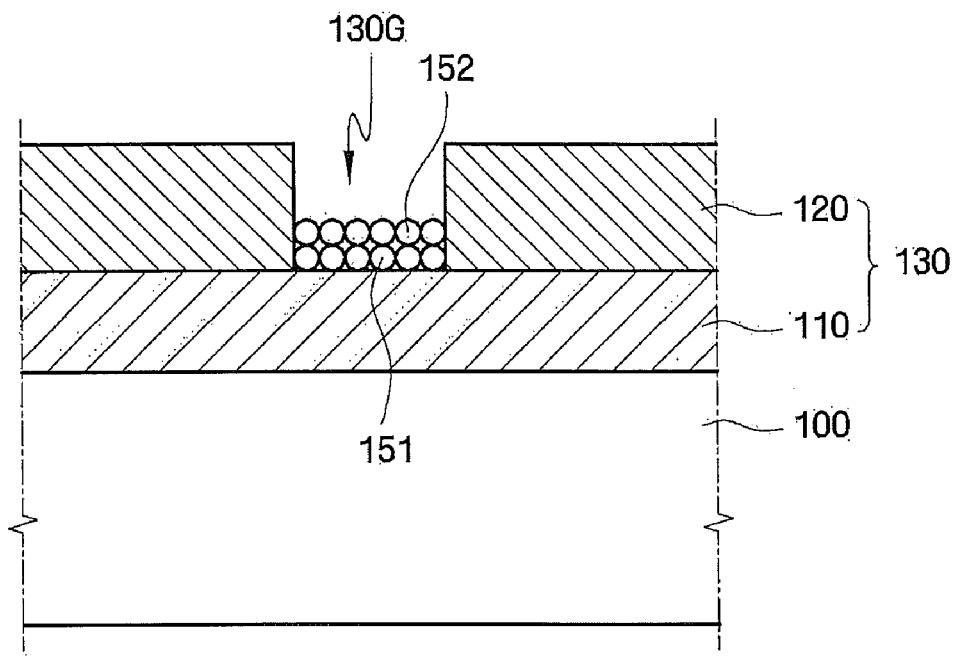

In some embodiments of the present invention, a plurality of nano lines may be disposed in the nano line arrangement region (NLA of FIG. 1), and at least two layers of nano lines may be layered in the nano line arrangement region. In the case of when two or more layers of nano lines are layered, since the greater number of nano lines are arranged in the nano line arrangement region, electrical properties may be improved. Microelectronic devices in which two or more layers of nano lines are layered are illustrated in FIGS. 10 and 11. In FIGS. 10 and 11, the nano line arrangement region in which multilayers of nano lines are arranged has a substantially similar structure as the nano line arrangement groove according to the embodiment of FIG. 3.

With reference to FIG. 10, the microelectronic device of FIG. 10 includes two layers of nano lines 151 and 152 that are layered in the nano line arrangement groove 130G.

A first nano line layer 151 that is provided as a single lower layer is coupled with the coupling layer 110 through the first linker 140. A second nano line layer 152 that is provided on the first nano line layer 151 as a single upper layer is coupled with the first nano line layer 151 through the second linker 145. The coupling using the second linker 145 may be achieved by, for example, covalent bonding.

In order to perform the coupling between the first nano line layer 151 and the second nano line layer 152, the second linker 145 may include a third functional group and a fourth functional group. The third functional group and the fourth functional group are functional groups that are capable of being coupled with the nano lines 151 and 152, respectively. Therefore, the second linker 145 may be represented by the following Formula 2.

   Formula 2

In the above Formula 2, X' denotes the third functional group, and Y' denotes the fourth functional group. B denotes a body of the second linker.

The nano lines 151 and 152 may be coupled with each other through the second linker 145. The coupling is achieved by means of the third functional group and the fourth functional group of the second linker. Accordingly, a variety of substances may be applied to B (i.e., is the body of the second linker 145). For example, a substance that contains a straight chain or branched chain alkyl group, an alkenyl group, an alkynyl group, a cycloalkyl group, and/or a cycloalkenyl group may be applied.

In the case of when the nano lines 151 and 152 are formed of carbon nano tubes, the third functional group and/or the fourth functional group that are covalently bonded to the nano lines may be a diazonium group such as $BF_4N_2$ and/or an amine group. The third functional group and the fourth functional group may be the same functional group.

Meanwhile, the mask layer pattern 120 may not be coupled with the second linker 145 and/or the bonding strength of the mask layer pattern to the second linker 145 may be less than that of the first nano line layer 151 to the second linker so that the second nano line layer 152 may be selectively coupled with only the first nano line layer 151. For example, as described above, in the case of when the mask layer pattern 120 is formed of a silicon nitride film and the third functional group and the fourth functional group of the second linker 145 are not formed of the diazonium group such as $BF_4N_2$, or the amine group, the covalent bonding between them may not be achieved.

With reference to FIG. 11, the microelectronic device of FIG. 11 includes two layers of nano lines 151 and 152 that are layered in the nano line arrangement groove 130G. In connection with this, two layers of nano lines 151 and 152 are directly coupled with each other while the first linker (reference numeral 140 of FIG. 10) and the second linker (reference numeral 145 of FIG. 10) are not provided between the nano lines 151 and 152. As described above, with reference to FIG. 5, the first nano line layer 151 may be directly coupled with the coupling layer by the van der Waals bonding force. In addition, in the case of the second nano line layer 152, the second nano line layer may be directly coupled with the first nano line layer 151 by the van der Waals bonding force.

Further embodiments of the present invention where other structures are formed on the substrate on which the nano lines are formed. Specific examples thereof are shown in FIGS. 12 and 13.

Figure 12:
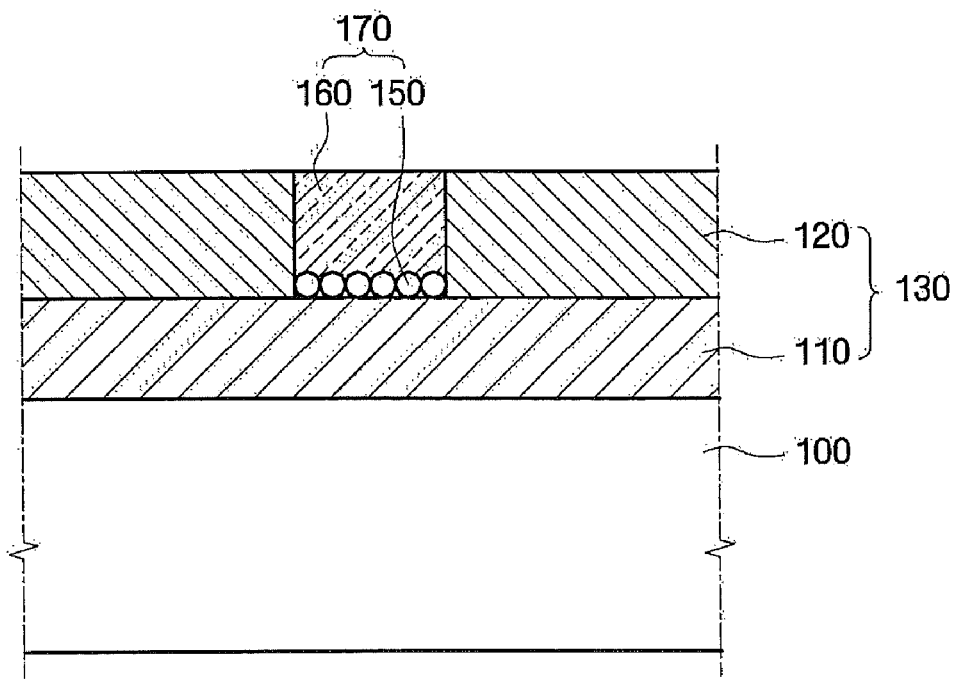

With reference to FIG. 12, the microelectronic device further includes a conductive layer 160 that is formed on the nano lines 150 and/or surrounding the nano lines 150. The conductive layer 160 may constitute an interconnector 170 in conjunction with the nano line 150. In the case of when the nano line 150 is formed of a carbon nano tube that has excellent electric properties and thermal properties, the interconnector 170 that includes the nano line 150 having the above-mentioned structure may have improved electric and thermal properties in comparison with the case of when the interconnector 170 is formed of only the conductive layer 160.

Figure 13:
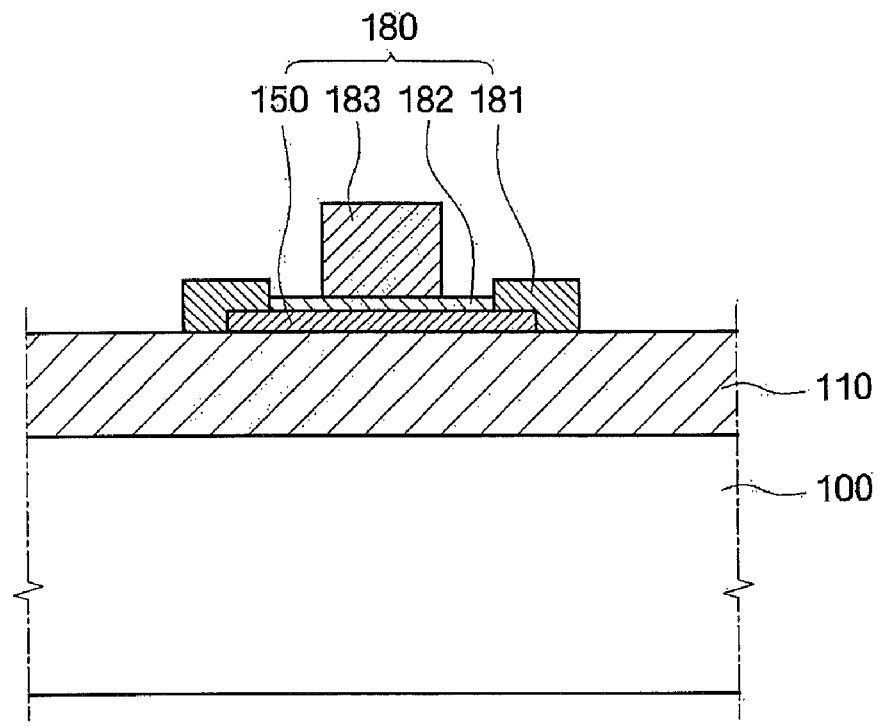

FIG. 13 is a cross-sectional view that is taken in the length direction of the nano line arrangement region of FIG. 2. With reference to FIG. 13, the microelectronic device of FIG. 13 further includes source/drain electrodes 181, a gate insulating layer 182, and a gate electrode 183 that are formed on a substrate 100. The source/drain electrodes 181 and the gate electrode 183 constitute a transistor 180 in conjunction with the nano line 150. In connection with this, the nano line 150 may constitute a channel portion of the transistor 180.

Hereinafter, methods of fabricating the above-mentioned microelectronic devices will be described. In the following embodiments, in cases where structures and/or materials of constituent elements are the same as those of the above-mentioned microelectronic devices, the description thereof may be omitted.

Figure 14:
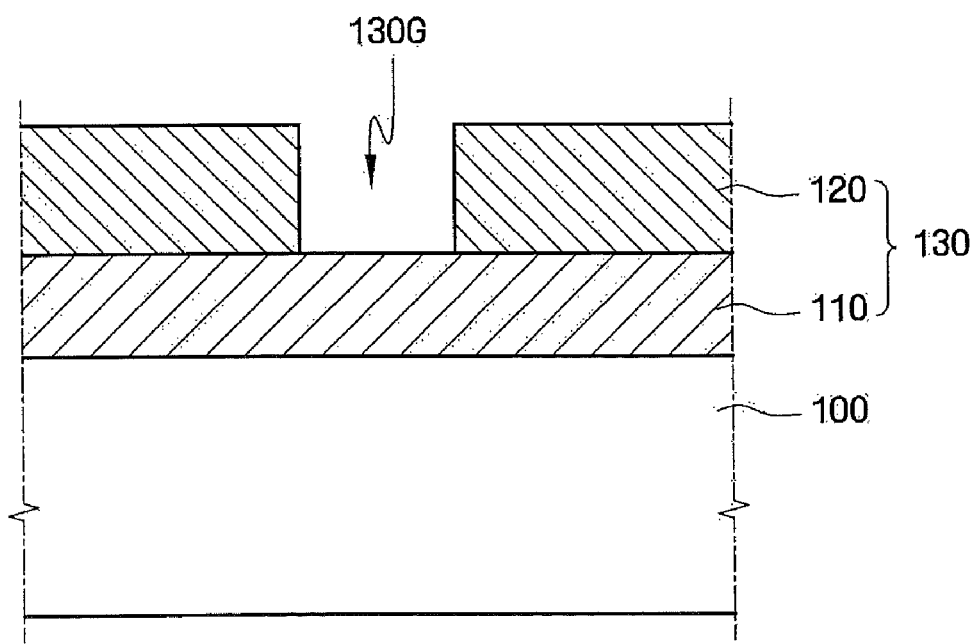
FIGS. 14 to 16 are cross-sectional views of intermediate structures illustrating fabrication of microelectronic devices according to some embodiments of the present invention.
Figure 15:
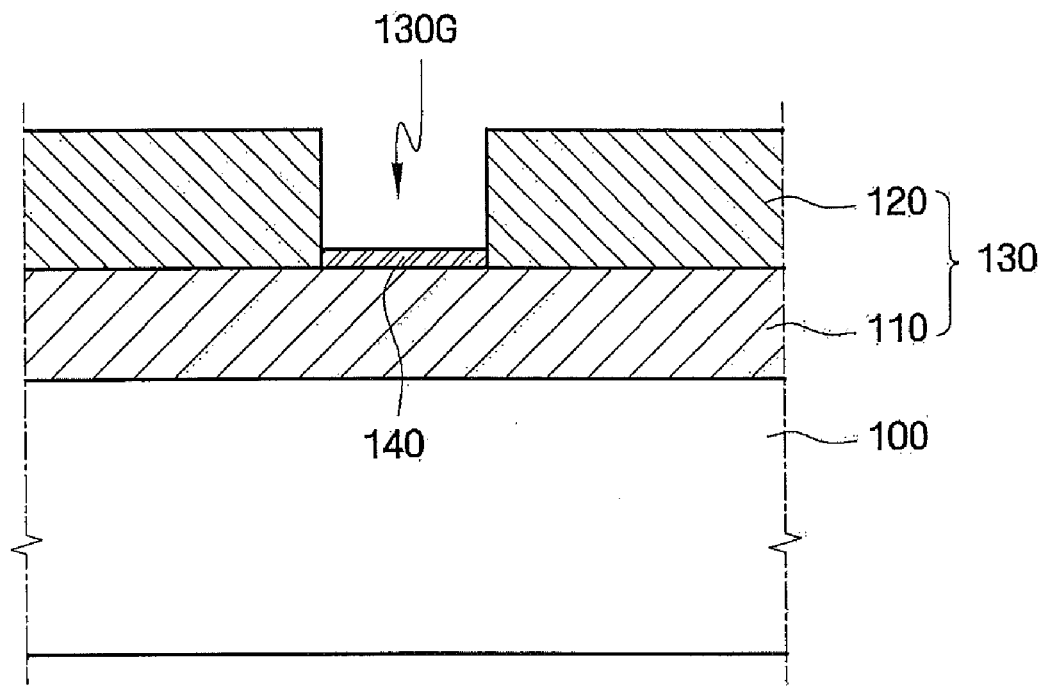
Figure 16:
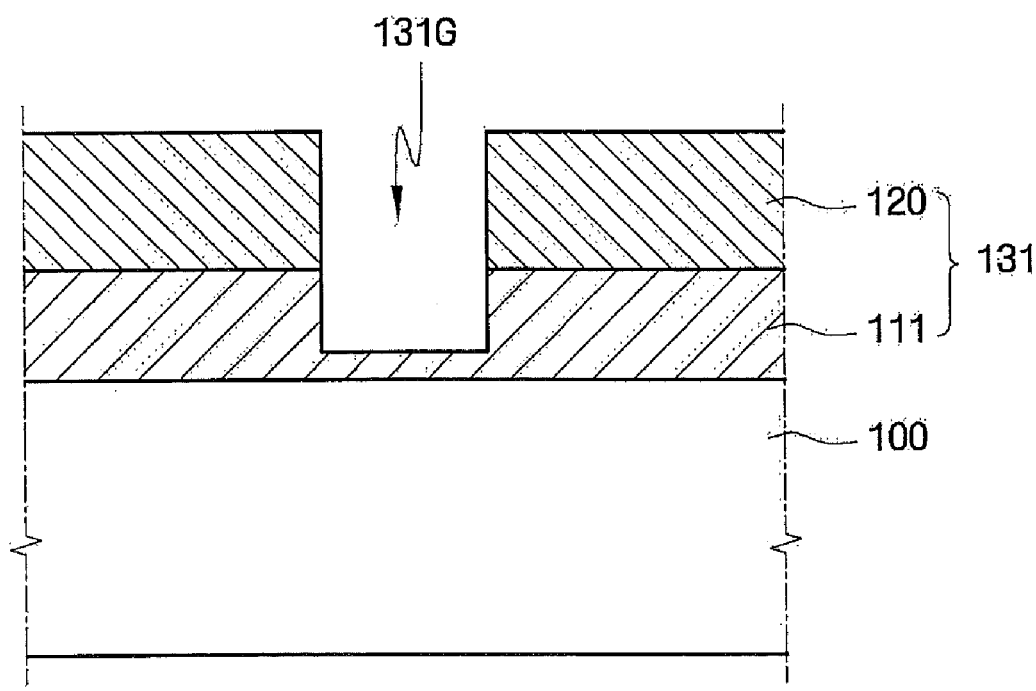

FIGS. 14 to 16 are cross-sectional views of intermediate structures which are provided to show the fabrication of the microelectronic devices according to some embodiments of the present invention.

With reference to FIG. 14, a coupling layer 110 is formed on a surface of a substrate 100.

Subsequently, a material layer for mask film is formed on the coupling layer 110, and then patterned to form a mask layer pattern 120, through which a predetermined region of the coupling layer 110 is exposed. The mask layer pattern 120 may be formed by using a photolithography process. In the photolithography process, transferring may be performed using the arrangement of photomasks. Accordingly, mask layer patterns 120 that have various sizes and/or various directions may be formed.

As a result, a groove structure 130 that includes a nano line arrangement groove 130G is completed. The nano line arrangement groove 130G includes the coupling layer 110, the mask layer pattern 120, and is defined by the exposed surface of the coupling layer 110, and sidewalls of the mask layer pattern 120.

With reference to FIG. 15, the first linker 140 is selectively coupled with the exposed surface of the coupling layer 110 in the nano line arrangement groove 130G.

To be more specific, a first solution that includes the first linker 140 having a first functional group and a second functional group is prepared. The first solution may contain an organic solvent. In addition, the first solution may further contain a surfactant.

Subsequently, the first solution is applied on the surface of the substrate 100, for example, using a spin coating process or a dip coating process. In order to maintain the number of first linkers 140 that are disposed in the nano line arrangement groove 130G, the first solution may be applied while low-speed rotation is performed. Accordingly, in the case of when the spin coating process is applied, the rotation speed is set to be low. In the case of when the dip coating process is applied, a rotation bar may be used.

In connection with this, the first functional group that is included in the first linker 140 is covalently bonded to the coupling layer 110, but not to the mask layer pattern 120. Therefore, the first linker 140 may be selectively coupled with only the exposed portion of the coupling layer 110 in the nano line arrangement groove 130G.

Next, the portions of the first linker 140 that remain on the mask layer pattern 120 are removed, for example, using a washing process. In connection with this, the first linker 140 that is strongly coupled with the exposed portion of the coupling layer 110 by the covalent bonding in the nano line arrangement groove 130G is not removed but remains even though the washing process is performed.

Subsequently, the nano line 150 is selectively coupled with the first linker 140 to complete the fabrication of the microelectronic device shown in FIG. 3.

To be more specific, a second solution that includes the nano line 150 is prepared. Subsequently, the second solution is applied on the surface of the substrate 100 through a similar procedure as in the case of the first solution. In connection with this, the nano line 150 is coupled with the second functional group that is included in the first linker 140 by covalent bonding. However, the nano line is not covalently bonded to the mask layer pattern 120.

Next, the portions of the nano line 150 that remain on the mask layer pattern 120 are removed, for example, using a washing process. In connection with this, the nano line 150 that is strongly coupled with the first linker 140 by the covalent bonding is not removed but remains even though the washing process is performed.

Meanwhile, in order to fabricate the microelectronic device of FIG. 5, the first linker 140 is removed after the above-mentioned process. The removal of the first linker 140 may be performed using various types of processes. For example, the removal of the first linker 140 may be performed using a heat treatment process at about 300° C. Since the first linker 140 is removed, the nano line 150 that is coupled with the first linker 140 comes into direct contact with the exposed portion of the coupling layer 110 in the nano line arrangement groove 130G. They are directly coupled with each other by the van der Waals bonding.

In addition, in order to fabricate the microelectronic device of FIG. 10, the first nano line layer 151 is coupled with the first linker 140 using the above-mentioned process, and the second linker 145 is formed using a substantially similar process as the first linker 140. Subsequently, the second nano line layer 151 is formed using a substantially similar process as the first nano line layer 151. In order to fabricate the microelectronic device that includes three or more layers of nano lines, the above-mentioned process is repeated. Furthermore, in order to fabricate the microelectronic device of FIG. 11, both the first linker 140 and the second linker 145 are removed using the heat treatment process.

Methods of fabricating the microelectronic devices of FIGS. 7 and 8 will be described with reference to FIG. 16.

With reference to FIG. 16, a coupling layer is formed on a surface of a substrate 100. Subsequently, a material layer for mask film is formed on the coupling layer, and then patterned to form a mask layer pattern 120, through which a predetermined region of a surface of the coupling layer is exposed. The exposed portion of the coupling layer is then etched using the mask layer pattern 120 as an etching mask. Thereby, the surface of the coupling layer 111 has a recess. The subsequent processes may be substantially similar to those of FIGS. 14 and 15.

Meanwhile, with respect to the microelectronic devices that do not include the mask layer pattern shown in FIGS. 6A, 6B, 9A, and 9C, the process of selectively removing the mask layer pattern may be further included. The selective removal of the mask layer pattern may be performed using, for example, a wet etching process.

In microelectronic devices according to embodiments of the present invention, since nano lines are precisely arranged in a nano line arrangement region, reliability of the position of the nano lines is improved. In addition, since the nano line arrangement region may be formed in various directions, it may be easier to arrange the nano lines in various directions.

In methods of fabricating the microelectronic devices according to the embodiments of the present invention, the nano line arrangement region may be easily formed in various directions to have various sizes. In addition, the nano lines may be selectively arranged in the nano line arrangement region using a first linker.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

That which is claimed:

1. A microelectronic device comprising:
    a substrate;
    a coupling layer on the substrate, wherein the coupling layer comprises a different material than the substrate;
    a linking layer on a surface of the coupling layer opposite the substrate, wherein the linking layer comprises a different material than the coupling layer and defines a nano line arrangement region having a length greater than a width thereof;
    a mask pattern on the coupling layer, the mask pattern having a trench extending therethrough to expose the linking layer, wherein opposing sidewalls of the trench in the mask pattern and the exposed linking layer therebetween define a nano line arrangement groove, and wherein sidewalls of the nano line arrangement groove include the opposing sidewalls of the mask pattern; and
    at least one nano line on the linking layer in the nano line arrangement region, wherein the at least one nano line has a length greater than the width of the nano line arrangement region and is coupled to the surface of the coupling layer by the linking layer,
    wherein the surface of the coupling layer having the linking layer thereon defines a recess that extends toward the substrate relative to a portion of the coupling layer having the mask pattern thereon, and wherein the sidewalls of the nano line arrangement groove further include opposing sidewalls of the coupling layer exposed by the recess in the coupling layer.

2. The microelectronic device of claim 1, wherein:
    the linking layer comprises a first functional group and a second functional group;
    the surface of the coupling layer is covalently bonded to the linking layer by the first functional group; and
    the at least one nano line is covalently bonded to the linking layer by the second functional group.

3. The microelectronic device of claim 2, wherein:
    the first functional group is an amine group and/or a silane group; and
    the second functional group is a diazonium group and/or an amine group.

4. The microelectronic device of claim 1, further comprising:
    a first plurality of nano lines coupled to the surface of the coupling layer by the linking layer; and
    a second plurality of nano lines on the first plurality of nano lines to define a multilayer structure comprising two nano line layers,
    wherein the two nano line layers which are vertically adjacent to each other in the multilayer structure are coupled with each other through another linking layer therebetween and/or are directly coupled with each other by van der Waals bonding.

5. The microelectronic device of claim 1, wherein the nano line is a carbon nano tube.

6. The microelectronic device of claim 5, further comprising:
    a conductive layer on the nano line.

7. The microelectronic device of claim 5, wherein the nano line comprises a channel portion of a transistor formed on the substrate.

8. The microelectronic device of claim 1, wherein a bonding strength of the mask pattern to the linking layer is less than that of a bonding strength of the coupling layer to the linking layer.

9. A microelectronic device, comprising:
    a substrate;
    a coupling layer on the substrate, wherein the coupling layer comprises a different material than the substrate;
    a plurality of nano line arrangement regions extending in different directions on the coupling layer, each of the nano line arrangement regions comprising a first linking layer on a surface of the coupling layer, wherein the first linking layer comprises a different material than the coupling layer;

a plurality of first nano lines on the first linking layer in each of the nano line arrangement regions and extending substantially along the respective direction thereof, the first nano lines having a length that is greater than a width of the respective nano line arrangement regions, wherein the first nano lines are covalently bonded to the surface of the coupling layer by the first linking layer in each of the nano line arrangement regions;

a second linking layer on the first nano lines in each of the nano line arrangement regions, wherein the second linking layer comprises a different material than the coupling layer; and a plurality of second nano lines on the second linking layer in each of the nano line arrangement regions, wherein the second linking layer is between the first nano lines and the second nano lines to define a multilayer structure comprising two nano line layers in each of the nano line arrangement regions, and wherein the second nano lines are coupled to the first nano lines by the second linking layer in each of the nano line arrangement regions, wherein:

the first linking layer in each of the nano line arrangement regions comprises first and second functional groups;

the first functional group covalently bonds the first linking layer to the surface of the coupling layer in each of the nano line arrangement regions;

the second functional group covalently bonds the plurality of first nano lines to the first linking layer in each of the nano line arrangement regions;

the second linking layer in each of the nano line arrangement regions comprises third and fourth functional groups;

the third functional group covalently bonds the second linking layer to the first nano lines in each of the nano line arrangement regions; and the fourth functional group covalently bonds the second nano lines to the second linking layer in each of the nano line arrangement regions.

10. The microelectronic device of claim 9, wherein:
the coupling layer comprises an oxide layer;
the mask pattern comprises a nitride layer;
the first functional group is an amine group and/or a silane group; and
the second functional group, the third functional group, and/or the fourth functional group is a diazonium group and/or an amine group.

11. A microelectronic device, comprising:
a substrate;
a coupling layer on the substrate, wherein the coupling layer comprises a different material than the substrate;
a first linking layer on a surface of the coupling layer opposite the substrate, wherein the first linking layer comprises a different material than the coupling layer and defines a nano line arrangement region having a length greater than a width thereof;
at least one first nano line on the first linking layer in the nano line arrangement region, wherein the at least one first nano line has a length greater than the width of the nano line arrangement region and is coupled to the surface of the coupling layer by the first linking a second linking layer on the at least one first nano line opposite the first linking layer; and
at least one second nano line on the second linking layer opposite the at least one first nano line to define a multilayer structure comprising two nano line layers, wherein the at least one second nano line is coupled to the at least one first nano line by the second linking layer, wherein:

the first linking layer comprises a first functional group and a second functional group;

the surface of the coupling layer is covalently bonded to the first linking layer by the first functional group;

the at least first one nano line is covalently bonded to the first linking layer by the second functional group;

the second linking layer comprises third and fourth functional groups;

the at least one first nano line is covalently bonded to the second linking layer by the third functional group; and the at least one second nano line is covalently bonded to the second linking layer by the fourth functional group.

12. The microelectronic device of claim 11, wherein the third functional group and the fourth functional group comprise a same material.

* * * * *